US005703762A

United States Patent [19]

[11] Patent Number: 5,703,762

Zell et al.

[45] Date of Patent: Dec. 30, 1997

[54] ARRANGEMENT FOR CONNECTING WIRING BACKPLANES AND MODULE CIRCUIT BOARDS

[76] Inventors: Karl Zell, Moritz-v-Schwind-Weg 80, 82343 Niederpoecking; Peter Seidel, Mittenwalderstr. 256, 82194 Groebenzell, both of Germany

[21] Appl. No.: 492,791

[22] Filed: Jun. 20, 1995

[30] Foreign Application Priority Data

Jun. 27, 1994 [DE] Germany ............................ 9410342 U

[51] Int. Cl.[6] ........................................................ H05K 9/00

[52] U.S. Cl. ........................ 361/816; 361/788; 174/35 C; 439/88; 439/289; 439/947

[58] Field of Search .................................... 361/785, 788, 361/789, 816, 818; 439/79–80, 108, 109, 101, 607, 608, 609, 947, 95, 88, 92, 289; 174/35 C

[56] References Cited

U.S. PATENT DOCUMENTS 4,571,014 2/1986 Robin et al. ............................ 439/289

*Primary Examiner*—Leo P. Picard
*Assistant Examiner*—Anthony Dinkins
*Attorney, Agent, or Firm*—Hill, Steadman & Simpson

[57] ABSTRACT

An arrangement for connection of wiring backplanes and module circuit boards wherein individual contact passages arranged in a housing are surrounded by electrically conductive shielding plates that are connected to contactings that carry shield potential. They are attached in the intermediate grid both at the backplane side as well as at the assembly side, and are charged with a corresponding potential. In order to create a connector arrangement for extremely high transmission frequencies and good transmission properties, terminal ends of spring elements of the sheet metal shielding compartment and terminal ends of the spring elements of shielding plates of the contact passages abut with a contacting layer of precious metal at the backplane side. Both the spring elements of the shielding plates arranged perpendicular to the wiring backplane as well as the spring elements of the shielding compartment proceeding perpendicular to the wiring backplane are corrugated. Terminal lugs are provided on the precious metal layer on the wiring backplane in the cooperating region of the terminal ends. The housing is mechanically secured to the wiring backplane at a plurality of locations.

5 Claims, 1 Drawing Sheet

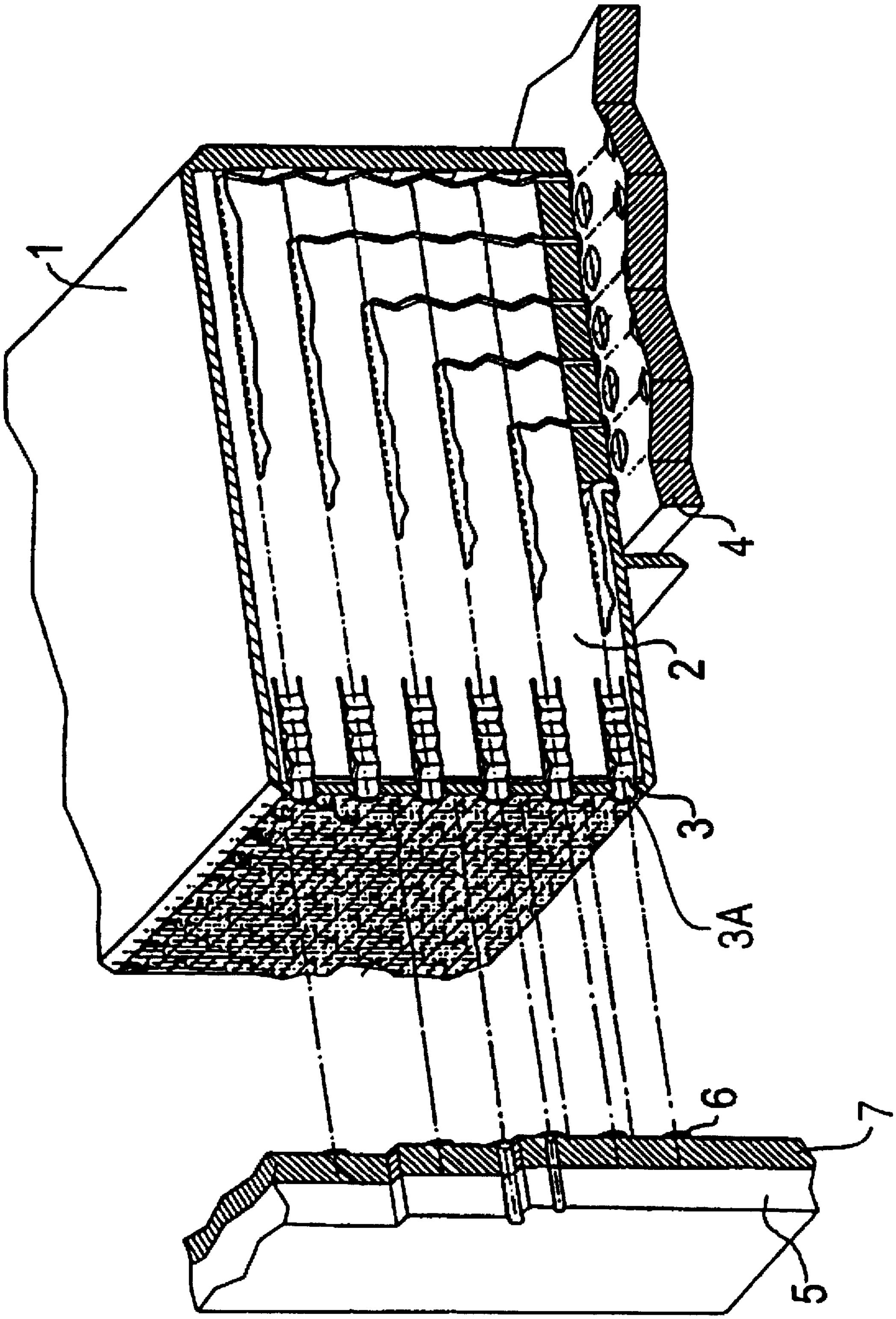
1
2
3
3A
4
5
6
7

ARRANGEMENT FOR CONNECTING WIRING BACKPLANES AND MODULE CIRCUIT BOARDS

BACKGROUND OF THE INVENTION

The invention is directed to an arrangement for connecting wiring backplanes and module circuit boards, whereby individual contact passages arranged in a housing are surrounded by electrically conductive shielding plates that are connected to contactings that carry shield potential, and which are attached in the intermediate grid both at the backplane side as well as at the assembly side and are charged with a corresponding potential.

Such an arrangement for connecting wiring backplanes and module circuit boards, whereby a shielding occurs in the intermediate grid, as recited above, has been disclosed, for example, by European Patent Application 94 103 192. In this known arrangement, the connection between the wiring backplane and the actual connector arrangement occurs via blades that are pressed into the wiring backplane and by contact springs accommodated in the connector housing. Such blades pressed into the wiring backplane lead to a non-optimum transmission behavior of the connector arrangement, given extremely high transmission frequencies in the Gigahertz range.

SUMMARY OF THE INVENTION

An object of the present invention is therefore comprised in creating a connector arrangement of the type initially cited wherein good transmission properties are assured, even given extremely high transmission frequencies.

In a connector arrangement of the present invention, this object is achieved in that terminal ends of spring elements of the sheet metal shielding compartment and terminal ends of spring elements of the shielding plates surrounding the contact passages are in abutting contact with a contacting layer of precious metal at the backplane side. Both the spring elements of the shielding plates surrounding the contact passages which are arranged perpendicular to the wiring backplane, as well as the spring elements of the shielding compartment proceeding perpendicular to the wiring backplane, are corrugated. Terminal lugs are provided on the wiring backplane in the cooperating region of the terminal ends. The housing is mechanically secured to the wiring backplane at a plurality of locations.

By eliminating the pressed-in blades, good transmission properties between the module circuit boards and the wiring backplanes can be achieved up into the Gigahertz range.

BRIEF DESCRIPTION OF THE DRAWINGS

The drawing illustrates the arrangement of the invention for connecting terminal ends of spring elements of a sheet metal shielding compartment and the terminal ends of spring elements of shielding plates surrounding contact passages within the shielding compartment to a wiring backplane by use of a precious metal layer on the backplane.

DESCRIPTION OF THE PREFERRED EMBODIMENTS

The housing 1 for the connection of wiring backplanes and module circuit boards is essentially composed of a sheet metal shielding compartment 2 inside of which the individual contact passages are arranged in insulated fashion with respect to one another. Both the sheet metal shielding compartment 2 as well as the shielding plates of the contact passages (not shown) are connected to the module circuit board 4.

Portions of the sheet metal shielding compartment facing toward the wiring backplane 5 comprises zig zag shaped corrugated spring elements 3 having the terminal ends 3A. The same is also true for spring elements of the shielding plates of the contact passages which also have terminal ends that are not shown in the drawing for the sake of clarity. They also comprise spring elements of a corrugated structure and thus have the same structure as spring elements 3 and the terminal ends 3A. The terminal ends of both the shielding plates of the contact passages as well as the terminal ends 3A that are allocated to the sheet metal shielding compartment 2 are in contact with a precious metal layer 7 for contacting at the free ends of the spring elements 3. Terminal lugs 6 are provided as a cooperating region for the terminal ends 3A at the precious metal layer 6 on the surface of the wiring backplane 5. The terminal lugs 6 project outwardly from the precious metal layer 6 on the wiring backplane 5 and are shaped to provide a mating contact with the terminal ends 3A. The particular shape may vary depending on the shape of the terminal ends 3A, but in this embodiment are illustrated in the drawing figure as rounded projecting bumps. Since the spring elements 3 of both the shielding plates surrounding the contact passages as well as of the sheet metal shielding compartment 2 are corrugated, it is possible to have a continuous force act with a defined stroke on the terminal lugs 6 of the precious metal layer 7 on the wiring backplane 5.

In its built-in condition (not shown here), the housing 1 is firmly screwed to the wiring backplane 5 or is connected thereto with some other mechanical connection, for example with a snap-in connection or with a press-in in order to absorb the contact force of the terminal ends 3A to the lugs 6. Since the contacting occurs on the outside surface of the circuit board, a press-in hole is no longer in the way of a desired interconnect or lane guidance.

Although the invention has been described with respect to preferred embodiments, it is not to be so limited as changes and modifications can be made therein which are within the full intended scope as defined by the appended claims.

We claim as our invention:

1. A system, comprising:

a module circuit board;

a wiring backplane;

a contact housing for connecting the module circuit board to the wiring backplane;

said contact housing being formed of a metal shielding compartment, portions of the metal shielding compartment facing toward the wiring backplane having a plurality of zig-zag shaped corrugated spring elements having terminal ends; and the wiring backplane having a metal layer for contacting to and at the terminal ends of said zig-zag-shaped corrugated spring elements.

2. The system according to claim 1 wherein the metal layer is a precious metal layer.

3. The system according to claim 1 wherein the metal layer has terminal lugs projecting outwardly from the metal layer and shaped to provide a mating contact with said terminal ends of said zig-zag shaped corrugated spring elements.

4. The system according to claim 3 wherein said terminal lugs comprise rounded projecting bumps.

5. The system according to claim 4 wherein said terminal ends of the zig-zag shaped corrugated spring elements project beyond an end face of the housing so that when the housing is securely attached to the wiring backplane the corrugated spring elements are in a forced contact with the corresponding portions of the metal layer of the wiring backplane.

* * * * *